United States Patent [19]

McGeary

[11] Patent Number: 5,064,686

[45] Date of Patent: Nov. 12, 1991

[54] SUB-VALENT MOLYBDENUM, TUNGSTEN, AND CHROMIUM AMIDES AS SOURCES FOR THERMAL CHEMICAL VAPOR DEPOSITION OF METAL-CONTAINING FILMS

[75] Inventor: Michael J. McGeary, Meriden, Conn.

[73] Assignee: Olin Corporation, Cheshire, Conn.

[21] Appl. No.: 605,718

[22] Filed: Oct. 29, 1990

[51] Int. Cl.$^5$ .................... C23C 16/06; C23C 16/32
[52] U.S. Cl. .................... 427/124; 427/250; 427/126.2; 427/126.1; 427/248.1; 427/255.1; 427/255.2; 427/255; 427/249; 427/314
[58] Field of Search .................... 427/124, 248.1, 255, 427/250, 314, 249, 126.1, 126.2, 255.1, 255.2

[56] References Cited

U.S. PATENT DOCUMENTS

| | | | |
|---|---|---|---|
| 3,565,676 | 2/1971 | Holzl | 427/250 |
| 4,150,905 | 4/1979 | Kaplan et al. | 401/205 |
| 4,162,345 | 7/1979 | Holzl | 428/328 |
| 4,349,408 | 9/1982 | Tarng et al. | 156/628 |
| 4,584,207 | 4/1986 | Wilson | 427/124 |
| 4,659,591 | 4/1987 | Gartner et al. | 427/253 |
| 4,696,833 | 9/1987 | Monnig et al. | 437/225 |
| 4,804,560 | 2/1989 | Shioya et al. | 427/125 |
| 4,853,347 | 8/1989 | Buckhman et al. | 437/192 |
| 4,874,642 | 10/1989 | Garg et al. | 427/249 |
| 4,902,645 | 2/1990 | Ohba | 437/200 |
| 4,923,715 | 5/1990 | Matsuda et al. | 427/237 |

OTHER PUBLICATIONS

Blocher, Jr., "Chemical Vapor Deposition" P335–338 in Deposition Technologies for Films and Coatings Edited by Bunshah et al., Noyes Publications, New Jersey, 1982.

Bradley et al., "Covalent Compounds of Quadrivalent Transition Metals Part V. Molybdenum (IV) Dialkylamides" Journal of the Chemical Society (A) 1971, pp. 2741–2744.

Chisholm et al., J. Am. Chem. Soc., 98 pages 4477–4485 (1976).

Chisholm et al., Inorg. Chem., 26, pp. 3182–3186 (1987).

Chisholm et al., Inorg. Synthesis, 21, pp. 51–56 (1982).

Chisholm et al., J. Am. Chem Soc., 98, pp. 4469–4476 (1976).

Primary Examiner—Shrive Beck
Assistant Examiner—Roy V. King
Attorney, Agent, or Firm—William A. Simons

[57] ABSTRACT

A thermal CVD process for forming a selected refractory metal-containing film onto a substrate comprising the steps of:

(a) introducing a subvalent refractory metal amide as a reactant gas capable of forming said metal-containing film into a CVD reaction zone containing said substrate on which said metal-containing film is to be formed; said subvalent metal amide having formula (I):

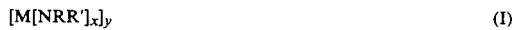

$$[M[NRR']_x]_y \qquad (I)$$

wherein M is molybdenum, tungsten, or chromium;
wherein R and R' are individually selected from hydrogen and lower alkyl groups having 1–4 carbon atoms, with the proviso that at least one of R or R' must be a lower alkyl group;
wherein x is selected from 2, 3, 4, or 5; and
wherein y is selected from 1 or 2.

(b) maintaining the temperature of said zone and said substrate at about 200° C. to about 1,000° C.;

(c) maintaining the pressure in said zone at about 0.001 torr to about 100 torr; and (d) passing said reacting gas or gases by said heated substrate for a period of time sufficient to form said metal-containing film thereon.

11 Claims, No Drawings

SUB-VALENT MOLYBDENUM, TUNGSTEN, AND CHROMIUM AMIDES AS SOURCES FOR THERMAL CHEMICAL VAPOR DEPOSITION OF METAL-CONTAINING FILMS

BACKGROUND OF THE INVENTION

1. Field of the Invention

The present invention relates to the use of selected molybdenum, tungsten, and chromium amides as sources for the chemical vapor deposition of metal-containing films.

2. Brief Description of the Relevant Art

Chemical Vapor Deposition (CVD) is a well known method for depositing a thin film onto a substrate. As electronic device dimensions continue to shrink, CVD techniques for forming conductive thin films have increased in importance in comparison to physical deposition methods. This trend is based on the superior ability of CVD methods to conformally coat severe topography. In particular, the chemical vapor deposition of metals in Group 6 of the Periodic Table of the Elements [especially tungsten (W) and molybdenum (Mo)] has emerged as the leading method for the construction of conductive films necessary to wire microelectronic circuits in high density devices.

One of the oldest CVD methods of depositing these metals is the so-called hexafluoride system. By this method the gaseous hexafluoride of the metal to be deposited is introduced into an enclosed reaction chamber containing a heated substrate. If a free metal is desired to be deposited, a reducing gas such as hydrogen is simultaneously introduced into the chamber. If a metal carbide is desired to be deposited, a carbon source gas is simultaneously added to the chamber. The gas flows are generally effected by means of a vacuum in the reaction chamber. There are various types of physical methods for effecting the metal deposit in the reaction chamber.

In the case of tungsten, the principal chemical reaction in the CVD reaction chamber where tungsten hexafluoride ($WF_6$) is the source gas and hydrogen is the reducing gas is shown by the following chemical equation:

$$WF_6 + 3H_2 \rightarrow W + 6HF$$

The by-product hydrogen fluoride (HF) is a gas at the usual CVD temperature range at which the tungsten (W) deposit is effected; and consequently the HF is removed from the reaction chamber with the unreacted source and reducing gases under vacuum.

U.S. Pat. No. 3,565,676, which issued to Holzl on Feb. 23, 1971, describes an improvement to the above-noted standard hexafluoride CVD method. He found that minor amounts of undesirable fluoride were entrapped in the tungsten, molybdenum and rhenium. This unwanted fluoride was believed by Holzl to be caused by side reaction which formed $WF_4$ and impaired the strength of the metal film and allowed the formation of voids in film during later high temperature processing. Holzl found that introducing a controlled amount of oxygen into the CVD hexafluoride system controlled the quantity of residual fluoride in the metal deposited.

U.S. Pat. No. 4,150,905, which issued to Kaplan et al. on Apr. 24, 1979, teaches the chemical vapor deposition of tungsten carbide and other carbides onto a metal spherical core substrate. The resulting coated spheres were used in highest quality ball point pens. This CVD process, in the case of making tungsten carbide (WC) films, employed a fluidizing gas such as a mixture of hydrogen gas ($H_2$) and one or more inert gases, for example, argon, helium and nitrogen. The tungsten source gas was tungsten hexafluoride and the carbon source gas was either methane ($CH_4$), butane ($C_4H_{10}$), acetylene ($C_2H_2$) or the like. The reaction chamber was heated to a temperature of about 500° C.–900° C. and held under vacuum. The chemical equation for this reaction using $CH_4$ as the carbon source is as follows:

$$CH_4 + H_2 + WF_6 \rightarrow WC + 6HF$$

The HF by-product gas was removed by the vacuum.

U.S. Pat. No. 4,162,345, which issued to Holzl on July 24, 1979, teaches that CVD techniques involving tungsten carbide resulted in relatively large grain size deposits which tended to be relatively brittle and mechanically weak. Moreover, the patentee urged that prior art CVD processes required the use of relatively high substrate temperatures and had relatively slow deposition rates. Accordingly, this patent proposes a two-stage CVD reaction where a gaseous halide of tungsten (e.g. $WF_6$) or molybdenum was reacted with an alcohol, ketone or ether to form a tungsten or molybdenum intermediate at a space away from the CVD substrate and then reacting that intermediate product with hydrogen gas and one or more gases containing oxygen and carbon. The final product, tungsten carbide or molybdenum carbide, is deposited onto the CVD substrate while the spent gases are removed.

U.S. Pat. No. 4,349,408, which issued to Tarng et al. on Sept. 14, 1982, teaches the chemical vapor deposition of a refractory metal such as tungsten or molybdenum onto a silicon substrate. This CVD process involves the reaction of the tungsten or molybdenum source gas (e.g. hexafluoride) with the silicon substrate itself. This is illustrated by the following reaction equation:

$$2WF_6 + 3Si \rightarrow 2W + 3SiF_4$$

The patent teaches that the reaction occurs in the range of about 600° C. to about 800° C. The patent further teaches that hydrogen gas may be additionally added later in the reaction to make a thicker layer of the tungsten or molybdenum metal.

U.S. Pat. No. 4,584,207, which issued to Wilson on Apr. 22, 1986, teaches a CVD process where tungsten metal is deposited onto a surface of previously deposited polycrystalline silicon surface and reacts with the polycrystalline silicon. The tungsten source gas for this CVD reaction is tungsten hexafluoride and hydrogen gas is additionally introduced. The reaction temperatures are about 225°–325° C.

U.S. Pat. No. 4,659,591, which issued to Gartner et al on Apr. 21, 1987, describes a CVD process for depositing tungsten metal using together tungsten hexafluoride as the tungsten source gas along with hydrogen gas, an inert gas like argon and a rare earth metal acetylacetonate hydrate.

U.S. Pat. No. 4,696,833, which issued to Moning et al on Sept. 29, 1987, teaches a hot wall CVD process wherein tungsten hexafluoride gas and hydrogen gas are the reactant gases and introduced into the reaction chamber in a specific manner.

U.S. Pat. No. 4,804,560, which issued to Shioya et al on Feb, 14, 1989, describes a CVD process of depositing tungsten metal in repeated stages using tungsten hexafluoride and hydrogen gas as the reactant gases.

U.S. Pat. No. 4,853,347, which issued to Bukhman et al on Aug. 1, 1989, describes a CVD process for depositing tungsten onto a wafer surface in a RIE reactor employing tungsten hexafluoride as the tungsten source material and subjecting it to a hydrogen plasma.

U.S. Pat. No. 4,874,642, which issued to Gary et al, teaches a CVD method of depositing a mixture of tungsten metal and tungsten carbide by employing a mixture of process gases comprised essentially of (1) tungsten hexafluoride, (2) a volatile oxygen and hydrogen-containing organic compound and (3) hydrogen.

U.S. Pat. No. 4,902,645, which issued to Ohba on Feb. 20, 1990, teaches CVD process using tungsten hexafluoride gas and a silicon hydrate in specified ratios to deposit a silicon-containing metal layer onto the CVD substrate surface.

U.S. Pat. No. 4,923,715, which issued to Matsuda et al on May 8, 1990, describes a method of preventing the deposition of tungsten metal films on the inner walls of the CVD reactor by use of a metal nitride film thereon.

Tungsten CVD is still practiced almost exclusively using tungsten hexafluoride ($WF_6$) as the tungsten source. CVD processes using $WF_6$ suffer from the following complications:

1. $WF_6$ deposits films with poor adhesion to silicon dielectrics owing to formation of surface Si-F groups at the layer interface.
2. Reduction of $WF_6$ by silicon is very favorable thermodynamically, resulting in likely undesirable silicon etching.
3. In the presence of hydrogen, HF is generated from $WF_6$ which can cause wormhole defects that adversely affect long term device reliability.
4. The above-stated by-products (HF and/or $SiF_4$) are toxic and corrosive.

It should be noted that CVD process using related molybdenum and chromium halides are little used because such halide sources are less volatile than $WF_6$.

Therefore, there is a need in the CVD art for volatile refractory metal CVD sources which do not generate toxic and/or corrosive by-products upon deposition. The present invention is believed to be a solution to that need.

Separate from the above art relating to CVD reaction, there is extensive art for making and using tungsten, molybdenum and chromium amides. For example Patent Cooperation Treaty Patent Publication No. 88/01603, filed by SRI International and published on Mar. 10, 1988, describes a process for making tungsten, molybdenum and chromium carbides by pyrolyzing the corresponding metal amides of the formula $M_x(NR_1R_2)_y$ where M is the metal atom; $R_1$ and $R_2$ either hydrogen, lower alkyl, trimethylsilyl or ethylene, with the proviso that both $R_1$ and $R_2$ are not hydrogen, x is 2 or greater and y is an integer equal to the valence of the $M_x$ unit.

The preparation of the compounds $Mo[N(CH_3)_2]_4$ and $Mo[N(C_2H_5)_2]_4$ is disclosed in Bradley et al "Covalent Compounds of Quadrivalent Transition Metals Part V. Molybdenum (IV) Dialkylamides" *Journal of the Chemical Society*, (A) 1971, pages 2741-2744.

The preparation of the compound $[W[N(CH_3)_2]_3]_2$ is disclosed in Chisholm et al, *J. Am. Chem. Soc*, 98, pages 4477-4485 (1976); Chisholm et al *Inorg. Chem.*, 26, pages 3182-3186 (1987); and Chisholm et al, *Inorg. Synthesis*, 21, pages 51-56 (1982).

The preparation of $[Mo[N(CH_3)_2]_3]_2$ is disclosed in Chisholm et al, *J. Am. Chem. Soc*, 98, pages 4469-4476 (1976) and in Chisholm et al *Inorg. Synthesis*, 21, pages 52-56 (1982). The preparation of $[Mo[N(CH_3)_2]_3]_2$ is disclosed by Chisholm et al, *J. Am. Chem Soc.*, 98, pages 4469-4476 (1976).

BRIEF SUMMARY OF THE PRESENT INVENTION

Accordingly, the present invention is directed to thermal CVD process for forming a selected refractory metal-containing film onto a substrate comprising the steps of:

(a) introducing a subvalent refractory metal amide as a reactant gas capable of forming said metal-containing film into a CVD reaction zone containing said substrate on which said metal-containing film is to be formed; said subvalent metal amide having formula (I):

$$[M[NRR']_x]_y \tag{I}$$

wherein M is molybdenum, tungsten, or chromium;
wherein R and R' are individually selected from hydrogen or lower alkyl groups having 1-4 carbon atoms, with the proviso that at least one of R or R' must be a lower alkyl group;
wherein x is selected from 2, 3, 4, or 5; and wherein y is selected from 1 or 2.

(b) maintaining the temperature of said zone and said substrate at about 200° C. to about 1,000° C.;
(c) maintaining the pressure in said zone at about 0.001 to about 100 torr; and
(d) passing said reacting gas or gases by said heated substrate for a period of time sufficient to form said metal-containing film thereon.

DETAILED DESCRIPTION

The CVD process of this invention may be used to produce refractory metal-containing films onto a substrate. The term "refractory metal-containing films" as used in the present specification and claims means films containing either tungsten, molybdenum, and chromium or mixtures thereof.

Substrates onto which the refractory metal-containing film is formed may be any suitable material upon which the refractory metal-containing film will be useful. This may include silicon wafers; plastic, resin, glass, or metal objects or films; GaAs layers; or any semiconductor layer or device. The substrate is heated prior to the deposition of the refractory metal-containing film on it.

While not critical, it is preferred to maintain the reaction chamber isothermal, by which is meant having temperature variations throughout of less than 2° C., preferable ±1° C. The reactant vapor is input at a sufficient distance from the wafers to be coated to permit the vapor to reach reaction temperature. Compared to the wafer mass, the vapor, at its input temperature, will not appreciably cool the wafer.

In the present invention, the refractory metal-containing film is formed from a subvalent refractory metal amide of formula (I) given above. The term "subvalent refractory metal amide" means an amide compound of one or more of the above-noted three selected refractory metals wherein the oxidation state of the metal atoms is less than +6.

Preferably, the metal M in formula (I) is either tungsten or molybdenum. Most preferably, M is tungsten.

Preferably, R and R' in formula (I) are individually selected from hydrogen, a methyl group, or an ethyl group, subject to above-stated proviso. Most preferably, R and R' are individually selected from hydrogen and a methyl group, subject to said proviso.

Suitable refractory metal amide precursors may include the following compounds:
Tetrakis(dimethylamido)molybdenum—$Mo[N(CH_3)_2]_4$
Hexakis(dimethylamido)ditungsten—$[W[N(CH_3)_2]_3]_2$ It is necessary to convert these room temperature solid amide compounds to a vapor before entering the CVD reactor. This is commonly done by heating the compounds above their sublimation temperatures.

Suitable sublimation temperatures of such amide compounds will depend upon the specific compound involved. Often, sublimination temperatures of at least 100° C. are necessary.

Once formed, the refractory metal amide vapor is preferably introduced in a substantially laminar flow over the substrate surface. The residence time over the substrate is kept short to eliminate substantial concentration variations over the substrate. The substrate, typically an Si wafer, is preferably confined in a manner so as to provide a reaction chamber wall to wafer edge spacing and wafer to adjacent wafer spacing such that the refractory metal-containing-type film produced by the process of this invention is substantially uniform across the wafer surface, i.e., does not exhibit substantial concavity (edge build-up) or convexity (center mounding). Examples of appropriate spacing of wafer to wafer and wafer to chamber wall are discussed in the references. Film uniformity obtained preferably exhibits less than ±35 Angstroms thickness variation, both within (across) the wafers, and from wafer to wafer in a batch or production run.

As mentioned above, the reaction chamber pressures are controlled in the range of from about 0.001 torr to about 100 torr. The preferred range being from about 0.01 to 10 torr. As also mentioned above, the reaction temperature is from about 200° C. to 1,000° C. The preferred temperature range is about 250° C. to about 500° C.

While the amide vapor may be introduced alone into the CVD reactor, it is optional to add co-reacting and/or inert carrier gases. Examples of co-reacting gases might include hydrogen, methane and the like. Examples of inert carrier gases include nitrogen, argon, helium and the like.

The following example further illustrates the present invention. All parts and percentages are by weight unless explicitly stated otherwise.

EXAMPLE 1

Synthesis of Tetrakis(dimethylamido)molybdenum, $Mo[N(CH_3)_2]_4$

Into a 500 ml flask equipped with a side arm valve to admit gases or vacuum, hexane (200 ml), tetrahydrofuran (120 ml), and $LiN(CH_3)_2$ [15.3 g (300 mmoles)] were charged. The resultant suspension was cooled in an ice bath for about 20 to 30 minutes. Then, while in the ice bath, $MoCl_5$ [16.2 g (60.0 mmoles)] was slowly added anaerobically to the flask over a period of about 15 minutes. After the $MoCl_5$ addition was complete, the mixture was stirred about 18 hours with gradual warming to room temperature.

After this stirring period, the flask was equipped with a condenser and the mixture therein was heated for 2 hours under reflux to ensure complete reaction of the $LiN(CH_3)_2$ and $MoCl_5$. Then, the flask and its contents were permitted to cool to room temperature. The contents were filtered to remove suspended solids. The filtrate was reduced to about 100 ml in vacuo.

The resultant purple solution was transferred via cannula to a sublimation apparatus. Then, the remaining solvent was removed by evaporation in vacuo, leaving a wet purple paste. This paste was then heated to about 100° C. at about $10^{-2}$ torr whereupon a purple solid sublimed into a vessel, previously cooled to −196° C. and subsequently collected. Product yield was not measured. Analysis by electron impact mass spectrometry and infrared spectroscopy confirmed the product formulation given in the title above.

EXAMPLE 2

Synthesis of Hexakis(dimethylamido)ditungsten, $[W[N(CH_3)_2]_3]_2$

Into a 500 ml flask equipped with a side arm valve to admit gases or vacuum, hexane (90 ml), tetrahydrofuran (150 ml), and $LiN(CH_3)_2$ (10.51 g, 206 mmole) were charged.

Into a second 500 ml flask, likewise equipped, was charged diethyl ether (100 ml). The flask containing diethyl ether was cooled in an ice bath for about 20 minutes. To this flask was slowly added $WCl_4$ (16.8 g, 51.4 mmole) anaerobically. A dark colored slurry formed.

The second flask and its contents were maintained in the ice bath. The contents from the first flask were transferred to the second flask via cannula over a period of about 15 minutes. After the addition of the hexane, tetrahydrofuran and $LiN(CH_3)_2$ was complete, the resultant mixture was stirred about 18 hours with gradual warming to room temperature.

After this stirring period, the second flask was equipped with a condenser, and the mixture therein was heated for about 2 hours under reflux to ensure complete reaction of the $LiN(CH_3)_2$ with $WCl_4$. The flask and its contents were permitted to cool to room temperature. At this juncture, all solvents were evaporated in vacuo, leaving a brown paste.

Hexane (200 ml) was then added to the flask. The flask and its contents were gently warmed using a hot air gun. The resultant suspension was then filtered to remove solids. The filtrate was collected, and its volume was reduced to about 100 ml in vacuo. The flask and its contents were then cooled to about −20° C. in a refrigerator. This caused brown micro-crystals to precipitate.

The micro-crystals were isolated by decantation followed by drying for about 20 minutes in vacuo. The micro-crystals were then loaded into a sublimation apparatus. The micro-crystals were then heated to about 120° C. at about $10^{-2}$ torr, whereupon a yellow-brown solid sublimed. The sublimate was collected. The product yield was not measured. Analysis by electron impact mass spectrometry, infrared spectroscopy, and hydrogen-1 nuclear magnetic resonance spectroscopy confirmed the product formulation given in the title above.

EXAMPLE 3

Hot Wall Deposition of a Metal Carbide Film with Mo[N(CH$_3$)$_2$]$_4$

A tube furnace into which a silicon wafer was loaded inside the reactor tube of the furnace was heated to about 400° C. While heating occurred, the reactor tube was purged with a flow of nitrogen which was introduced through a port in the reactor tube. The reactor tube was subsequently depressurized to about 0.01 torr. After reaching 400° C., the reactor tube and silicon wafer were allowed to reach thermal equilibrium over a period of approximately 30 minutes. The reactor pressure was then adjusted to about 0.5 torr.

A source ampoule was charged with solid Mo[N(CH$_3$)$_2$]$_4$ made according to the procedure of Example 1. This source ampoule was attached to the reactor tube by stainless steel lines previously heated to about 150° C. This source ampoule was then heated to about 100°–110° C. A valve between the ampoule and the reactor tube was opened. The purple Mo[N(CH$_3$)$_2$]$_4$ sublimed into the reactor causing a metal-containing film to deposit on the silicon wafer.

When all of the source was consumed, the reactor tube was repressurized with nitrogen to atmospheric pressure while its temperature remained at about 400° C. The silicon wafer was removed to a nitrogen-flushed receiver flask for cooling to ambient temperature. The thickness of the deposited metal film on the wafer was measured by sputtered Auger analysis, and the film thickness was found to be about 5,000 Angstroms. The Auger profile also indicated the film contained molybdenum and carbon but little nitrogen. Powder X-ray diffraction analysis of film peelings indicated Mo$_2$C was present in the film.

EXAMPLE 4

Cold Wall Deposition of a Tungsten Carbide Film With [W[N(CH$_3$)$_2$]$_3$]$_2$

A cold wall chemical vapor deposition reaction equipped with side arm ports to admit gases or vacuum and a substrate heater was depressurized to about 0.01 torr. A silicon wafer, previously attached to the reactor substrate heater, was then heated to about 300° C. as measured with a thermocouple probe attached directly to the substrate mount. The substrate was kept at 300° C. for approximately 30 minutes in order to ensure substrate temperature stability. At this juncture, the reactor was repressurized to room pressure with argon. With the substrate temperature being maintained at 300° C., the tungsten source, [W(N(CH$_3$)$_2$)$_3$]$_2$, prepared by the method outlined in Example 2, was loaded onto the base of the reactor.

The reactor was again depressurized to about 0.01 torr. The base of the reactor was slowly warmed to about 100° C. by immersion in a thermostated oil bath. Vapors of [W(N(CH$_3$)$_2$)$_3$]$_2$ were gradually transported to the heated substrate over a period of about 4 hours, whereupon the source compound decomposed, leaving a tungsten-containing film. The film appears uniform and shiny in appearance. When all the tungsten source had been consumed, the reactor was repressurized to room pressure with argon. The coated silicon wafer was permitted to cool to room temperature in this argon atmosphere. The thickness of the deposited metal film on the wafer was measured by sputtered Auger analysis, and the film thickness was found to be about 3,000 Angstroms. The Auger profile revealed that the film contained tungsten and carbon but little nitrogen.

EXAMPLE 5

Cold Wall Deposition of a Metal Carbide Film with Mo[N(CH$_3$)$_2$]$_4$

A cold wall chemical vapor deposition reactor, equipped with side arm ports to admit gases or vacuum and a substrate heater, was depressurized to about 0.01 torr. A silicon wafer, previously attached to the reactor substrate heater, was then heated to about 300° C. as measured with a thermocouple probe attached directly to the substrate mount. The substrate was kept at 300° C. for approximately 30 minutes in order to ensure substrate temperature stability. At this juncture, the reactor was repressurized to room pressure with argon. With the substrate temperature being maintained at 300° C., the molybdenum source, Mo[N(CH$_3$)$_2$]$_4$, prepared by the method outlined in Example 1, was loaded onto the base of the reactor.

The reactor was again depressurized to about 0.01 torr. The base of the reactor was initially immersed in an ice bath and then permitted to gradually warm to room temperature. Vapors of Mo[N(CH$_3$)$_2$]$_4$ were gradually transported to the heated substrate over a period of about 4 hours, whereupon the source compound decomposed leaving a molybdenum-containing film. When all the molybdenum source had been consumed, the reactor was repressurized to room pressure with argon. The coated silicon wafer was permitted to cool to room temperature in argon. The thickness of the deposited metal film on the wafer was measured by sputtered Auger analysis, and the film thickness was found to be about 400 Angstroms. The Auger profile revealed that the film contained molybdenum carbon and nitrogen.

COMPARISON 1

Atmospheric Pressure Deposition of a Metal Carbide Film with Mo[N(CH$_3$)$_2$]$_4$ An atmospheric pressure, hot wall chemical vapor deposition reactor was constructed as outlined below. A quartz tube of about 0.8 cm inside diameter and about 40 cm long was wrapped with heating tape over the middle 20 cm of the tube's length. A thermocouple was attached to the center of the heat tape wrapped area. The tube was fitted at one end with an exit bubbler partially filled with mineral oil. The other end of the tube was fitted with a source bubbler. This reactor was equipped with appropriate T-junctions and isolation valves so that the reaction tube could be purged with H$_2$(10%)/N$_2$(90%) (volume:volume) without exposing the reaction tube to reactant source vapors. Alternatively, by opening appropriate isolation valves, vapors of the reactant source could be made to flow through the reactor tube.

The reactor tube was heated to 300° C. by means of the heating tape mentioned above. As the temperature of the reactor tube was increased from room temperature to 300° C., the reactor tube was purged with a 25 sccm flow of H$_2$(10%)/N$_2$(90%) (volume:volume). When the reactor tube had attained 300° C., the source bubbler which had been previously loaded with reactant source, [Mo[N(CH$_3$)$_2$]$_4$] (0.38 g, 1.40 mmole), was opened to the reactor tube using the isolation valves mentioned above. The flow of H$_2$(10%)/N$_2$(90%) (volume:volume) was immediately increased to 100 sccm. The source tube was periodically warmed with a hot air gun during the deposition experiment. During this experiment, partial decomposition of the reactant source [Mo[N(CH$_3$)$_2$]$_4$], in the source bubbler, was observed.

The deposition experiment was conducted for about 8 hours. After this period, the source bubbler was isolated from the reactor tube by means of the valves mentioned above. Heating of the reactor tube was discontinued. The reactor tube was permitted to cool to room temperature in a flow of H$_2$(10%)/N$_2$(90%) (volume:volume). At this point, the reactor tube was disconnected from the source bubbler and the exit bubbler; the heating tape was removed. A shiny, poorly adherent film was observed on the interior walls of the tube.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A thermal CVD process for forming a selected refractory metal-containing film onto a substrate comprising the steps of:

(a) introducing a subvalent refractory metal amide as a reactant gas capable of forming said metal-containing film into a CVD reaction zone containing said substrate on which said metal-containing film is to be formed; said subvalent metal amide having formula (I):

$$[M[NRR']_x]_y \quad (I)$$

wherein M is molybdenum, tungsten, or chromium;

wherein R and R' are individually selected from hydrogen and lower alkyl groups having 1–4 carbon atoms, with the proviso that at least one of R or R' must be a lower alkyl group;

wherein x is selected from 2, 3, 4, or 5; and wherein y is selected from 1 or 2.

(b) maintaining the temperature of said zone and said substrate at about 200° C. to about 1,000° C.;

(c) maintaining the pressure in said zone at about 0.001 torr to about 100 torr; and (d) passing said reacting gas or gases by said heated substrate for a period of time sufficient to form said metal-containing film thereon.

2. The thermal CVD process of claim 1 wherein said M is tungsten.

3. The thermal CVD process of claim 1 wherein M is molybdenum.

4. The thermal CVD process of claim 1 wherein R and R' are both either hydrogen, methyl or ethyl groups.

5. The thermal CVD process of claim 4 wherein x is 3 or 4.

6. The thermal CVD process of claim 5 wherein said subvalent metal amide is Mo[N(CH$_3$)$_2$]$_4$.

7. The thermal CVD process of claim 5 wherein said subvalent metal amide is [W[N(CH$_3$)$_2$]$_3$]$_2$.

8. The thermal CVD process of claim 1 wherein said temperature of said zone and said substrate is from about 250° C. to about 500° C.

9. The thermal CVD process of claim 1 wherein said pressure of said zone is from about 0.01 torr to about 10 torr.

10. The thermal CVD process of claim 1 wherein said substrate is selected from the group consisting of silicon wafers, plastic objects or films, resin objects or films, metal objects or films, GaAs, or any semiconductor layer or device.

11. A thermal CVD process for forming a selected refractory metal-containing film onto a substrate, comprising the steps:

(a) introducing a subvalent refractory metal amide as a reactant gas capable of being thermally converted into said metal-containing film into a CVD reaction zone containing said substrate on which said metal-containing film is to be formed; said subvalent metal amide having formula (I):

$$[M[NRR']_x]_y \quad (I)$$

wherein M is molybdenum, tungsten, or chromium;

wherein R and R' are individually selected from hydrogen and lower alkyl groups having 1–4 carbon atoms, with the proviso that at least one of R or R' must be a lower alkyl group;

wherein x is selected from 2, 3, 4, or 5; and wherein y is selected from 1 or 2.

(b) maintaining the temperature of said zone and said substrate at about 250° C. to about 500° C.;

(c) maintaining the pressure in said zone at about 0.01 torr to about 10 torr; and (d) passing said metal amide gas by said heated substrate for a period of time sufficient to form said metal-containing film thereon.

* * * * *